(12) United States Patent
Ichikawa

(10) Patent No.: US 8,324,947 B2
(45) Date of Patent: Dec. 4, 2012

(54) OUTPUT APPARATUS AND TEST APPARATUS

(75) Inventor: Hiroki Ichikawa, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/154,418

(22) Filed: Jun. 6, 2011

(65) Prior Publication Data
US 2011/0298522 A1 Dec. 8, 2011

Related U.S. Application Data

(63) Continuation of application No. PCT/JP2010/000637, filed on Feb. 3, 2010.

(30) Foreign Application Priority Data

Feb. 18, 2009 (JP) .................................. 2009-035847

(51) Int. Cl.
*H03K 3/00* (2006.01)
*H03K 5/12* (2006.01)

(52) U.S. Cl. ............................ 327/170; 327/108; 326/30

(58) Field of Classification Search .................. 327/108, 327/261, 203, 270, 276, 170, 134; 326/30, 326/26
See application file for complete search history.

(56) References Cited

U.S. PATENT DOCUMENTS

| | | | |
|---|---|---|---|
| 6,710,617 B2 * | 3/2004 | Humphrey | 326/30 |
| 7,215,161 B2 * | 5/2007 | Nguyen | 327/100 |
| 7,579,873 B1 * | 8/2009 | Jiang et al. | 326/83 |
| 7,710,169 B2 * | 5/2010 | Tanaka | 327/112 |
| 7,719,314 B1 * | 5/2010 | Jiang et al. | 326/83 |
| 2005/0218945 A1 | 10/2005 | Kobayashi | |
| 2008/0094112 A1 | 4/2008 | Tanaka | |

FOREIGN PATENT DOCUMENTS

| | | |
|---|---|---|
| JP | H9-093116 A | 4/1997 |
| JP | 2005-294947 A | 10/2005 |
| JP | 2008-125061 A | 5/2008 |
| JP | 2008-205749 A | 9/2008 |
| JP | 2008-219718 A | 9/2008 |

OTHER PUBLICATIONS

International Search Report (ISR) for International application No. PCT/JP2010/000637 mailed on Mar. 2, 2010.
English translation of Written Opinion (IB338) for International application No. PCT/JP2010/000637 mailed on Sep. 22, 2011.

* cited by examiner

*Primary Examiner* — Dinh T. Le

(74) *Attorney, Agent, or Firm* — Ryuka

(57) ABSTRACT

Provided is an output apparatus that outputs an output signal corresponding to an input signal, comprising a plurality of drivers that each output an intermediate signal having a waveform corresponding to the input signal; an adding section that adds together the intermediate signals output from the drivers and outputs the result as the output signal; and a control section that controls a difference in delay amount, which is from when the input signal begins to change to when the intermediate signal begins to change, among the drivers according to a designated slew rate.

13 Claims, 11 Drawing Sheets

US 8,324,947 B2

OUTPUT APPARATUS AND TEST APPARATUS

BACKGROUND

1. Technical Field

The present invention relates to an output apparatus and a test apparatus.

2. Related Art

A device such as a DDR is known that transmits a clock signal in parallel with a data signal. Such a device can transmits multi-bit data in a single cycle of the clock signal, and can therefore achieve a high data transmission rate.

With this device, however, the range of the slew rate of the data signal and the clock signal that can be acquired changes depending on the quality of the device. Therefore, when this device is shipped, a test apparatus is used to test whether the device can acquire a signal with a prescribed slew rate.

SUMMARY

Therefore, it is an object of an aspect of the innovations herein to provide an output apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is an output apparatus that outputs an output signal corresponding to an input signal, comprising a plurality of drivers that each output an intermediate signal having a waveform corresponding to the input signal; an adding section that adds together the intermediate signals output from the drivers and outputs the result as the output signal; and a control section that controls a difference in delay amount, which is from when the input signal begins to change to when the intermediate signal begins to change, among the drivers according to a designated slew rate. Also provided is a test apparatus including this output apparatus.

According to a second aspect related to the innovations herein, provided is an output apparatus that outputs an output signal corresponding to an input signal, comprising a driver that outputs an intermediate signal having a waveform corresponding to the input signal; a correction driver that outputs a correction signal having a waveform corresponding to the input signal; a high-pass filter that passes a high-frequency component of the correction signal output from the correction driver; an adding section that adds together the intermediate signal output from the driver and the correction signal passed through the high-pass filter, and outputs the result as the output signal; and a control section that sets a voltage level of the correction signal output from the correction driver, according to a designated slew rate. Also provided is a test apparatus including this output apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
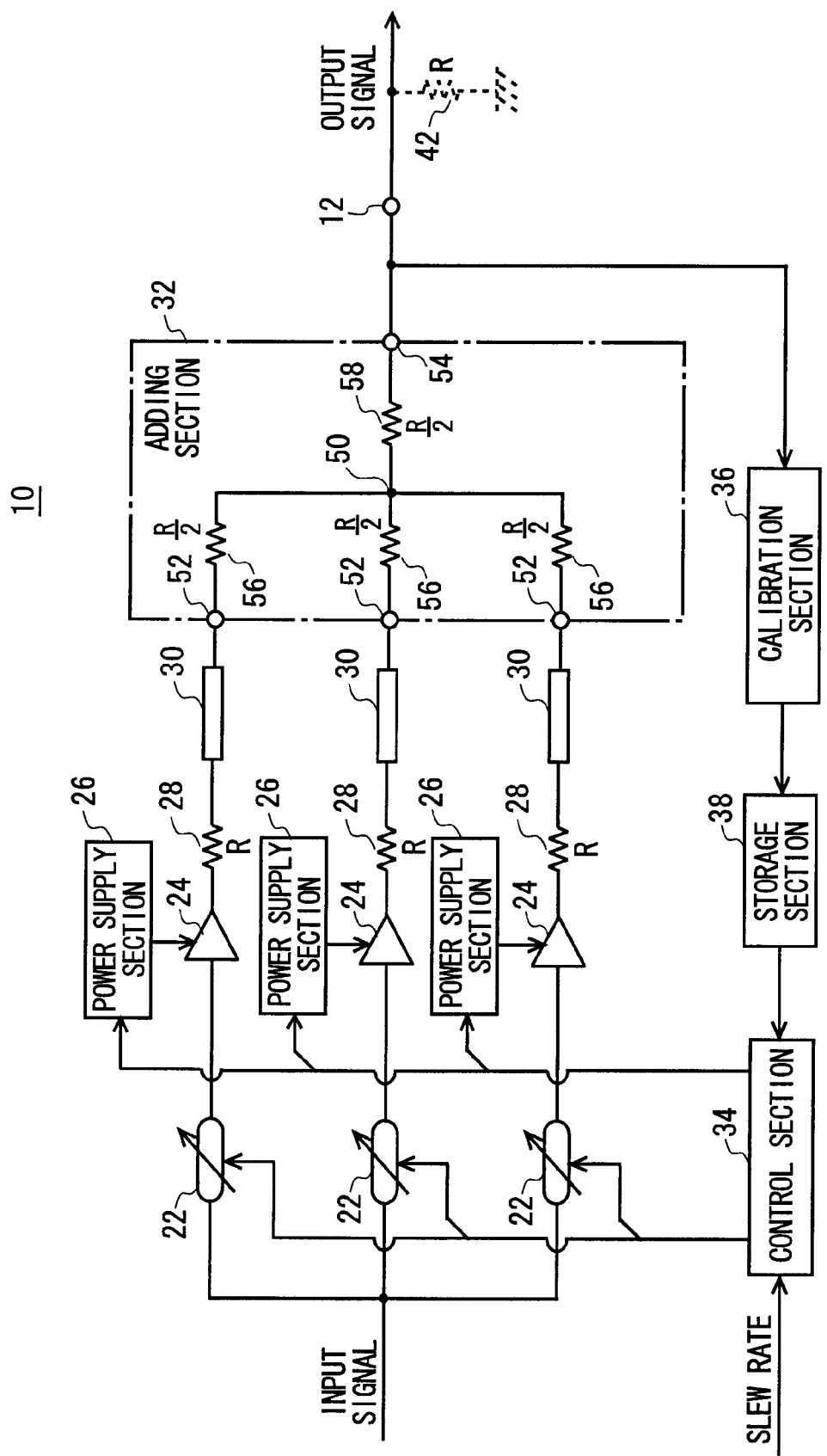
FIG. 1 shows a configuration of an output apparatus 10 according to an embodiment of the present invention.

FIG. 1 shows a configuration of an output apparatus 10 according to an embodiment of the present invention. The output apparatus 10 outputs an output signal having a voltage waveform corresponding to an input signal. The output apparatus 10 includes a plurality of variable delay sections 22, a plurality of drivers 24, a plurality of power supply sections 26, a plurality of output resistances 28, a plurality of transmission paths 30, an adding section 32, a control section 34, a calibration section 36, and a storage section 38.

The variable delay sections 22 are provided to correspond one-to-one with the drivers 24. Each variable delay section 22 has a delay amount set by the control section 34. Each variable delay section 22 delays an input signal input to the output apparatus 10 by the set delay amount, and outputs the resulting signal.

Each driver 24 receives the input signal delayed by the corresponding variable delay section 22, and outputs an intermediate signal with a waveform corresponding to the received input signal. Each driver 24 may be a buffer circuit that amplifies and outputs a voltage signal supplied thereto, for example. The drivers 24 may be the same type of voltage buffer and have substantially the same characteristics.

The power supply sections 26 are provided to correspond one-to-one with the drivers 24. Each power supply section 26 provides a drive voltage to the corresponding driver 24 to control the voltage level of the intermediate signal output by the driver 24. The level of the drive voltage of each power supply section 26 may be set by the control section 34.

The output resistances 28 are provided to correspond one-to-one with the drivers 24. The transmission paths 30 are provided to correspond one-to-one with the drivers 24.

Each output resistance 28 may have one end thereof connected to an output end of the corresponding driver 24. Each transmission path 30 may have one end thereof connected to the end of the corresponding output resistance 28 that is not connected to the driver 24. The end of each transmission path 30 that is not connected to the output resistance 28 is connected to the adding section 32. Each pair of an output resistance 28 and a transmission path 30 connected in series in this manner can transmit the intermediate signal of the corresponding driver 24 to the adding section 32.

The adding section 32 receives the intermediate signal output by each driver 24 through the output resistances 28 and the transmission paths 30. The adding section 32 adds together the intermediate signals output from the drivers 24, and outputs the result as the output signal.

The adding section 32 may include a plurality of input-side resistances 56 and an output-side resistance 58, for example. The input-side resistances 56 correspond one-to-one with the drivers 24.

Each input-side resistance 56 is provided between a connection node 50 and an input node 52 that receives the intermediate signal output by the corresponding driver 24. The output-side resistance 58 is provided between the connection node 50 and an output node 54 that outputs the output signal to the outside. With this configuration, the adding section 32 can add together the voltage levels of the intermediate signals output from the drivers 24.

In the present embodiment, the adding section 32 has a resistance value, as seen from the output end 12 side of the output apparatus 10, that is equal to the resistance value of a termination resistance 42 connected between a reference potential and the output end 12 of the output apparatus 10. For example, if the resistance value of each output resistance 28 is R$\Omega$, e.g. 50$\Omega$, and the resistance value of the termination resistance 42 is R$\Omega$, e.g. 50$\Omega$, the output-side resistance 58 and the input-side resistances 56 may each have a resistance of R/2$\Omega$, e.g. 25$\Omega$. Instead, each input-side resistance 56 may be 0$\Omega$, i.e. there may be a short between the connection node 50 and each input node 52, and the output-side resistance 58 may have a resistance value of R×2/3$\Omega$, e.g. 33.3$\Omega$.

A slew rate is designated for the control section 34 from the outside. The control section 34 may set the delay amount from when the input signal begins to change to when the intermediate signal begins to change for each driver 24 such that there are differences between the delay amounts, according to the designated slew rate. For example, the control section 34 may set a delay amount corresponding to the designated slew rate for each variable delay section 22.

In addition, the control section 34 may further set the voltage level of the intermediate signal output from each driver 24 according to the designated slew rate. For example, the control section 34 may set a drive voltage corresponding to the designated slew rate for each power supply section 26.

The calibration section 36 measures the delay amount difference among the drivers 24 that results in an output signal with the designated slew rate being acquired. For example, the calibration section 36 may measure the delay amount of each variable delay section 22 that results in the output signal having the designated slew rate.

The calibration section 36 may supply the input signal to each variable delay section 22 when a delay amount is set for each variable delay section 22, and measure the slew rate of the output signal output from the adding section 32. The calibration section 36 changes each delay amount difference among the variable delay sections 22 gradually by a prescribed amount, and measures the slew rate in the same manner. As a result, the calibration section 36 can detect each delay amount of the variable delay section 22 resulting in an output signal with the designated slew rate being obtained.

In addition, the calibration section 36 may measure each combination of a delay amount difference among the drivers 24 and a voltage level of the intermediate signal output by the drivers 24 that results in the output signal with the designated slew rate being obtained. For example, the calibration section 36 may change the combination of a difference among the delay amounts provided to variable delay sections 22 and a voltage level of the intermediate signal output by the drivers 24 by a prescribed amount, and measure the slew rate.

The storage section 38 stores measurement results from the calibration section 36. For example, the storage section 38 may store a table indicating correspondence between the slew rate designated for the control section 34 and the delay amounts set for each variable delay section 22. The control section 34 reads the delay amounts of the variable delay sections 22 corresponding to the designated slew rate, and sets the read delay amounts in the corresponding variable delay sections 22. As a result, the control section 34 can set the delay amount differences among the drivers 24 based on the measurement results of the calibration section 36.

In addition, the storage section 38 may store a table indicating correspondence between the slew rate designated for the control section 34 and the voltage levels of the intermediate signals output by the drivers 24. The control section 34 reads the voltage levels of the intermediate signals output by the drivers 24 corresponding to the designated slew rate, and sets the corresponding power supply sections 26 to have drive voltages corresponding to the read voltage levels. In this way, the control section 34 can set the voltage level of the intermediate signal output by each driver 24 based on the measurement results of the calibration section 36.

Figure 2:
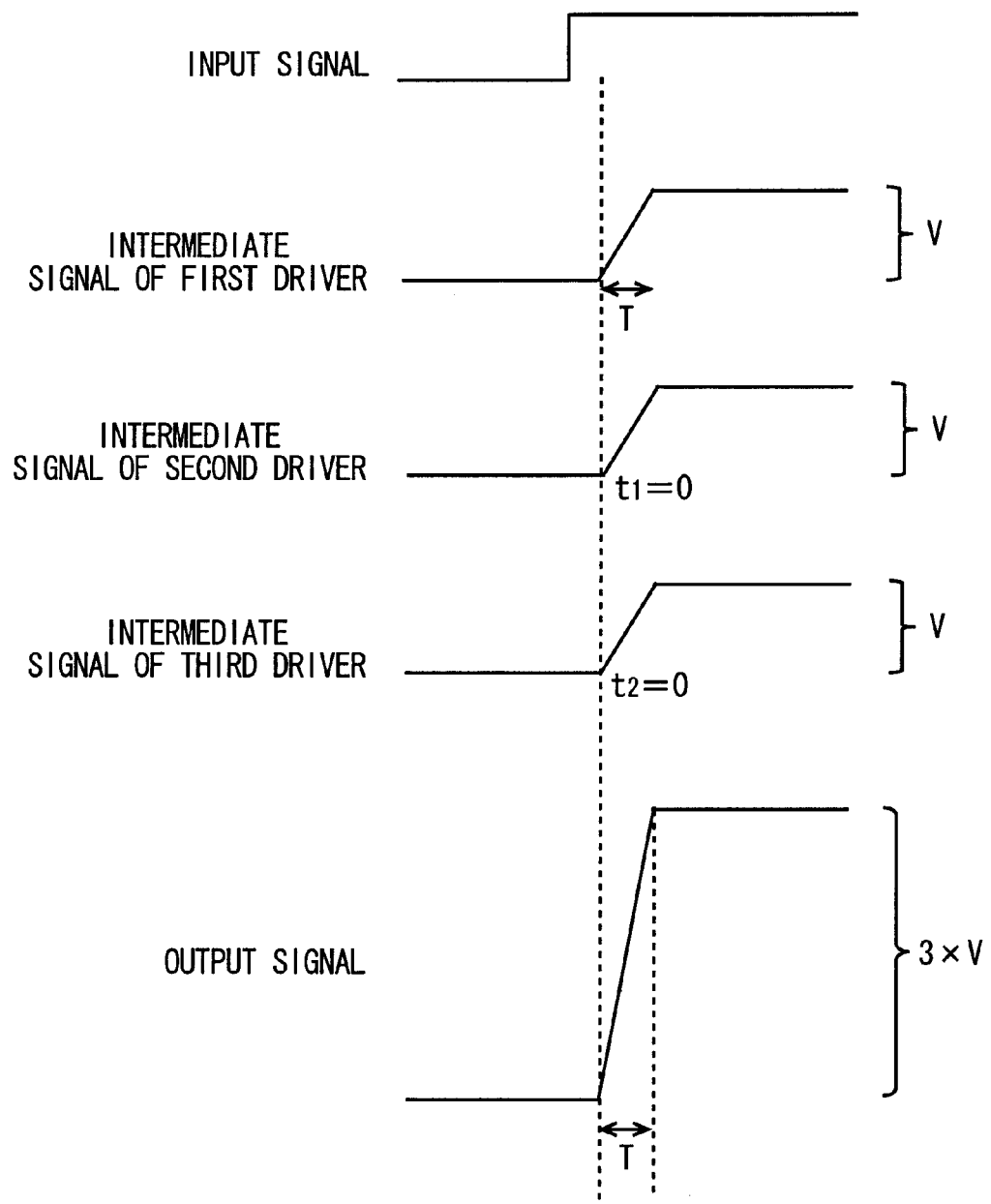
FIG. 2 shows examples of an input signal, intermediate signals, and an output signal obtained when the difference in the delay amount among the drivers 24 is zero.
Figure 3:
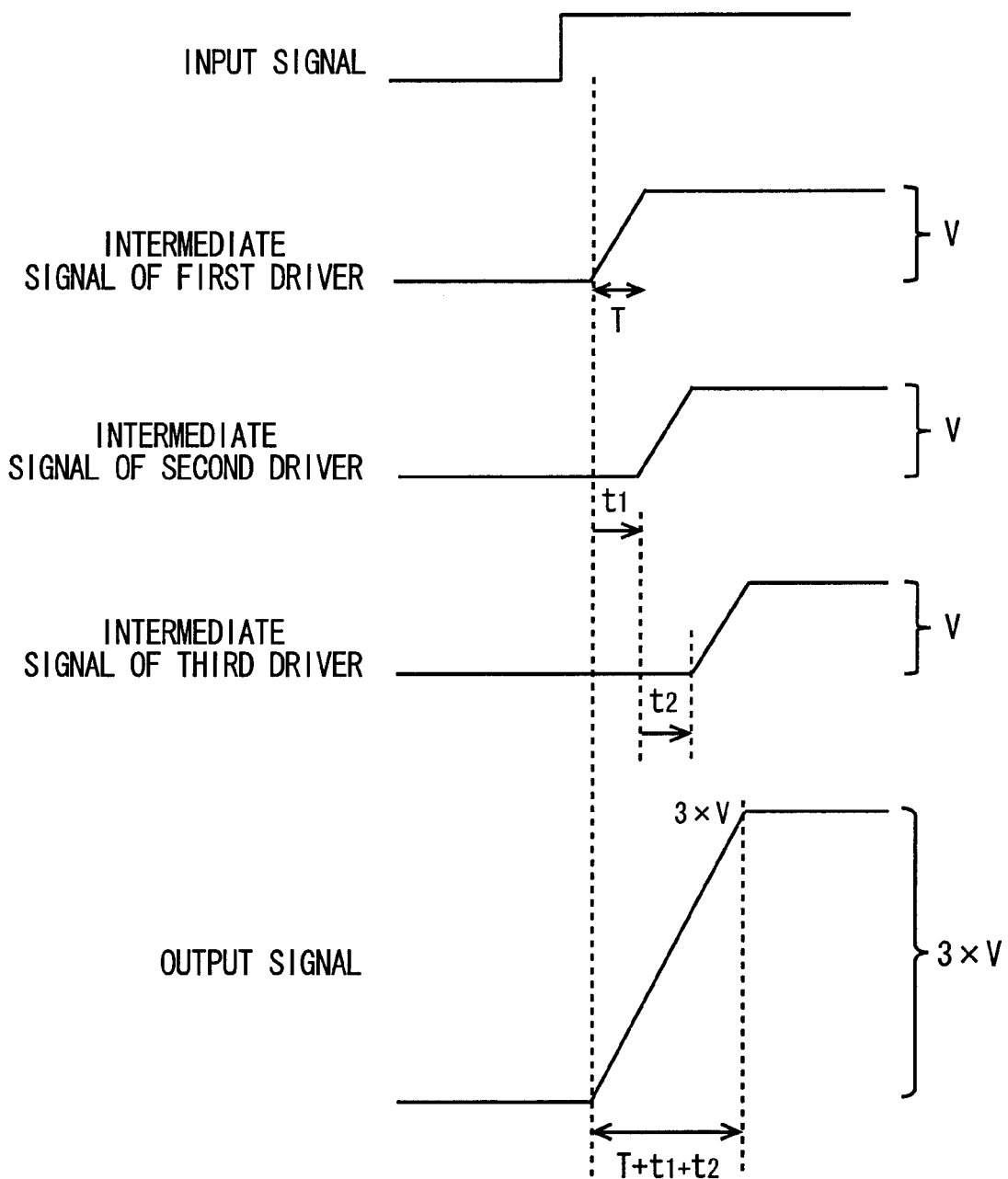
FIG. 3 shows examples of an input signal, intermediate signals, and an output signal obtained when there is a delay amount difference of t1 between the first driver 24 and the second driver 24 and a delay amount difference of t2 between the second driver 24 and the third driver 24.

FIG. 2 and FIG. 3 each show an exemplary input signal supplied to the output apparatus 10, intermediate signals output from the first to third drivers 24, and an output signal output from the output apparatus 10. FIG. 2 shows signals obtained when the difference in the delay amount, from when the input signal begins to change to when the intermediate signal begins to change, among the drivers 24 is zero. FIG. 3 shows signals obtained when there is a delay amount difference of t1 between the first driver 24 and the second driver 24 and a delay amount difference of t2 between the second driver 24 and the third driver 24.

The amplitude of the output signal is the sum of the amplitudes of the intermediate signals output from the drivers 24. For example, if the intermediate signal output from each of the three drivers 24 has a voltage amplitude of V volts, the output signal will have a voltage amplitude of 3×V volts.

The time period from when the output signal begins to change to when the change of the output signal ends (referred to hereinafter as the "change period") is a period from a change start timing of the intermediate signal that begins changing first until a change end timing of the intermediate signal that stops changing last. For example, if the change period of each of the intermediate signals output from the first to third drivers 24 is T, the delay amount difference between the first driver 24 and the second driver 24 is t1, and the delay amount difference between the second driver 24 and the third driver 24 is t2, the change period of the output signal is equal to T+t1+t2.

In the present example, the timing at which a signal begins to change, i.e. the change start timing, is a timing at which the level of the signal changes from a base level by a first amplitude ratio, e.g. by 20%. Furthermore, the timing at which the change of a signal ends, i.e. the change end timing, is a timing at which the level of the signal changes from a base level by a second amplitude ratio, e.g. by 80%, where the second amplitude ratio is greater than the first amplitude ratio.

Here, the slew rate of the signal is the slope, i.e. the amount of change over time of the signal. When the delay amount difference among the drivers 24 is large, the change period of the output signal is longer. Accordingly, the slew rate of the output signal is smaller when the different delay amount difference among the drivers 24 is larger. Therefore, the control section 34 can change the slew rate of the output signal by changing the delay amount difference among the drivers 24.

When the total amplitude of the intermediate signals is large, the amplitude of the output signal is also large. Accordingly, the slew rate of the output signal is larger when the total amplitude of the intermediate signals is larger. Therefore, the control section 34 can also change the slew rate of the output signal by changing the voltage levels of the intermediate signals output by the drivers 24.

The control section 34 can maximize the slew rate of the output signal by setting the delay amount difference among the drivers 24 to be zero. Furthermore, the control section 34 can change the output signal with good linearity by uniformly shifting the delay amount differences between the drivers 24. For example, the control section 34 can change the output signal with good linearity by causing the delay amount difference t1 between the first driver and the second driver to be the same as the delay amount difference t2 between the second driver and the third driver.

The control section 34 may set the delay amount differences between the drivers 24 in a range that causes the change period of the output signal to be no greater than the sum of the change times of the intermediate signals output by the drivers 24. For example, when the change period of each of the intermediate signals output by the first to third drivers 24 is T, the control section 34 sets the delay amount difference between each pair of drivers 24 to be in a range that causes the change period of the output signal to be no greater than 3×T. As a result, the control section 34 can change the output signal with good linearity.

Figure 4:
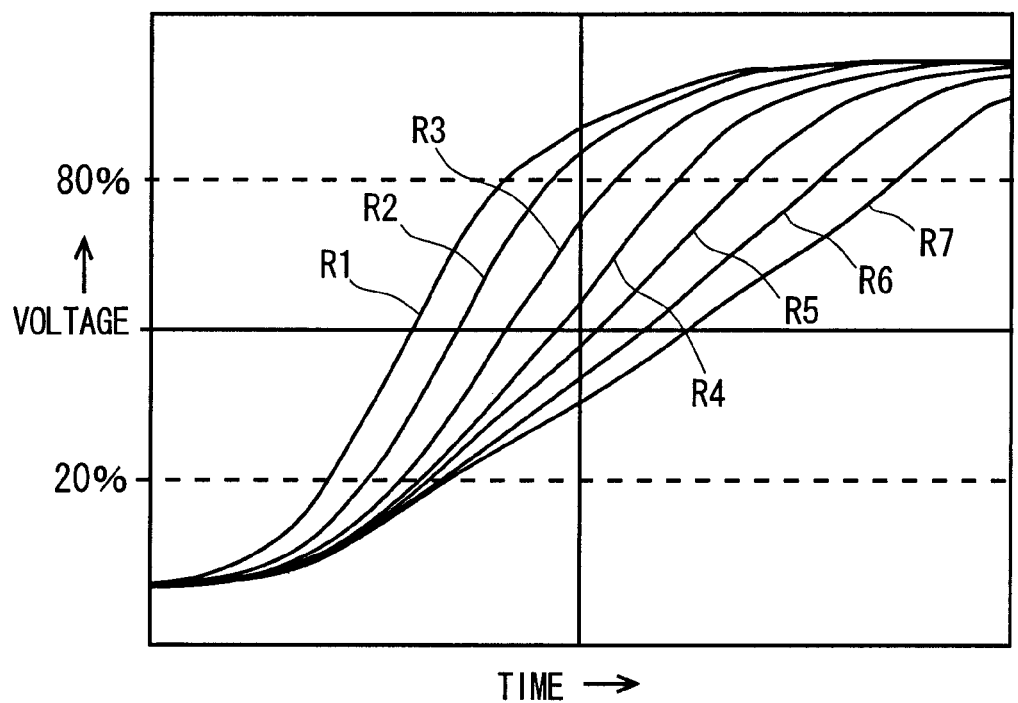
FIG. 4 shows a first example of a rising waveform of the output signal.
Figure 5:
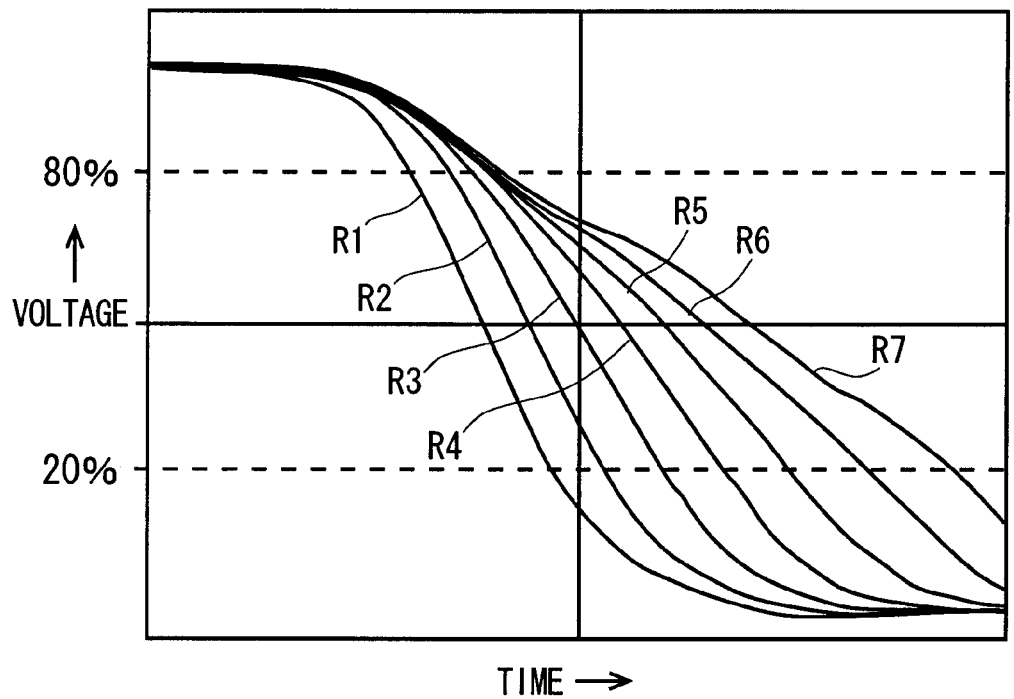
FIG. 5 shows a first example of a falling waveform of the output signal.

FIG. 4 shows a first example of a rising waveform of the output signal when each delay amount difference among the drivers 24 is changed. FIG. 5 shows a first example of a falling waveform of the output signal when each delay amount difference among the drivers 24 is changed.

FIGS. 4 and 5 show waveforms that result from each delay amount difference among three channels of drivers 24 being changed from 0 ps to 300 ps in steps of 50 ps. As shown in FIGS. 4 and 5, the output apparatus 10 can gradually change the slew rate of the output signal by changing each delay amount difference among the drivers 24.

Figure 6:
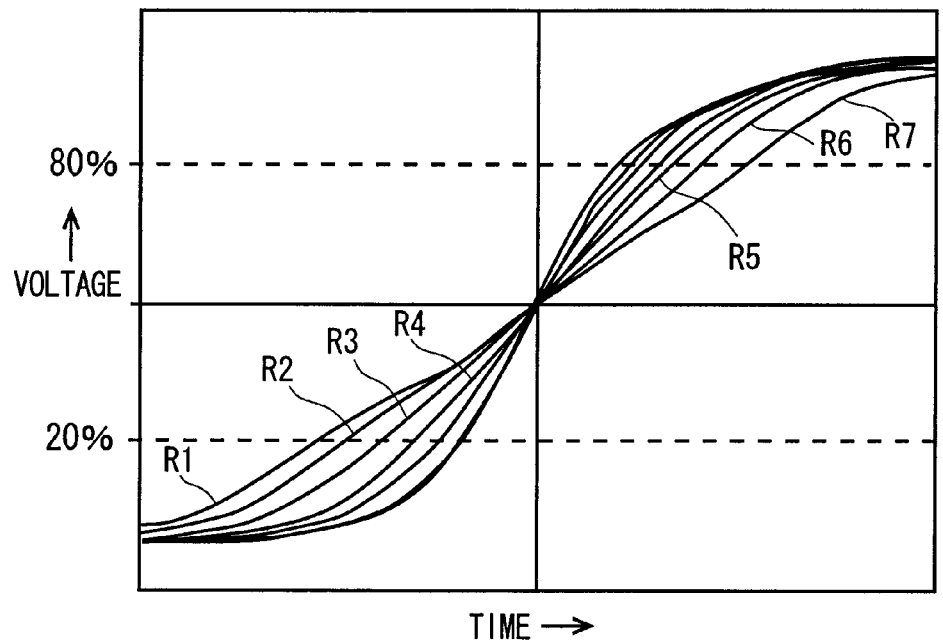
FIG. 6 shows a second example of a rising waveform of the output signal.
Figure 7:
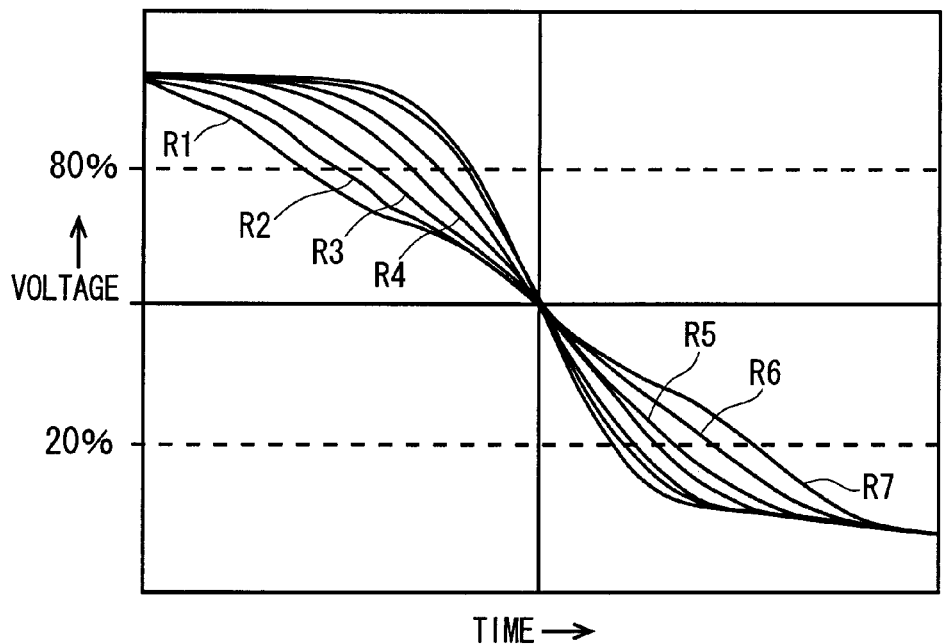
FIG. 7 shows a second example of a falling waveform of the output signal.

FIG. 6 shows a second example of a rising waveform of the output signal when each delay amount difference among the drivers 24 is changed. FIG. 7 shows a second example of a falling waveform of the output signal when each delay amount difference among the drivers 24 is changed.

In the same manner as FIGS. 4 and 5, FIGS. 6 and 7 show waveforms that result from each delay amount difference among three channels of drivers 24 being changed from 0 ps to 300 ps in steps of 50 ps. As shown in FIGS. 6 and 7, the control section 34 may set each delay amount difference among the drivers 24 such that the time from when the input signal begins to change to when the output signal reaches the prescribed voltage level remains the same. For example, the control section 34 may set each delay amount difference among the drivers 24 such that the timing at which the amplitude of the output signal is at 50% is the same, regardless of the change in the slew rate.

Figure 8:
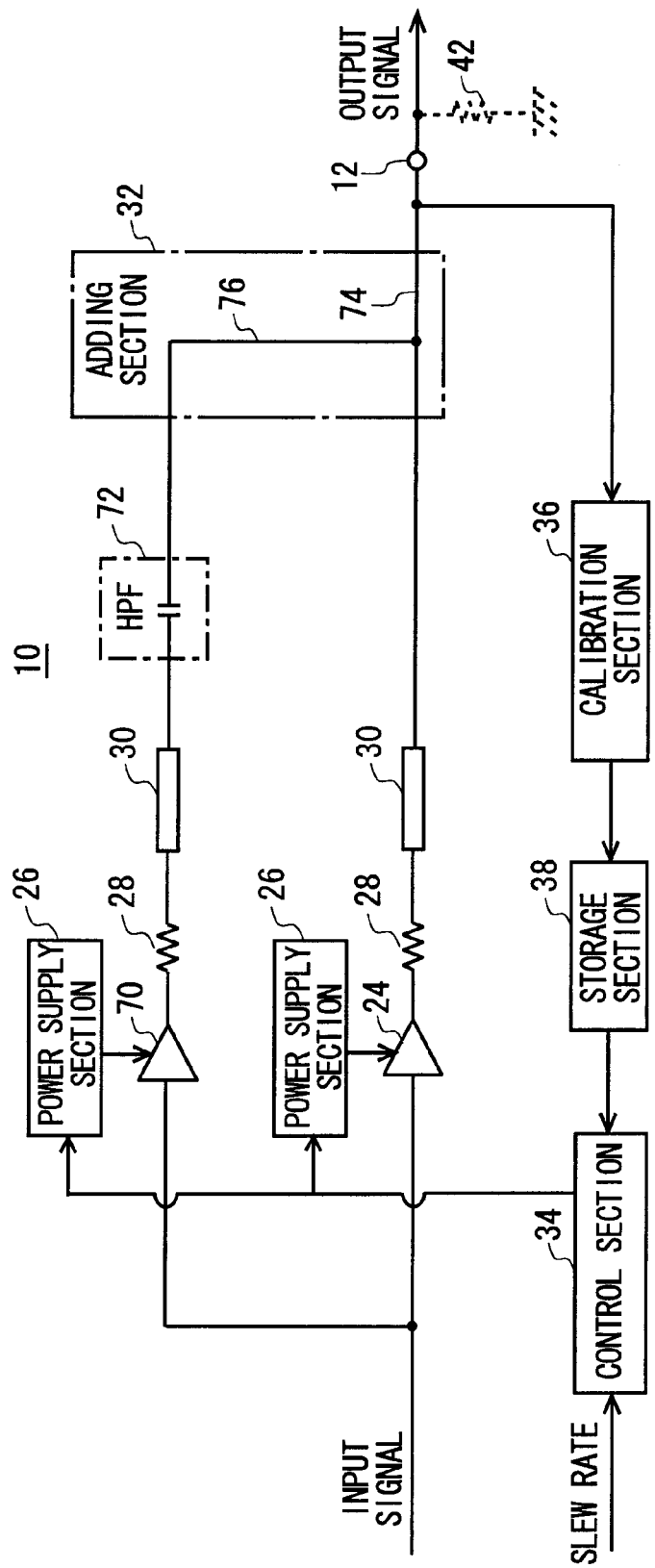
FIG. 8 shows an exemplary configuration of an output apparatus 10 according to a first modification of the present embodiment.

FIG. 8 shows an exemplary configuration of an output apparatus 10 according to a first modification of the present embodiment. The output apparatus 10 of the present modification adopts substantially the same function and configuration as the output apparatus 10 shown in FIG. 1, and therefore components that are substantially the same as those of the output apparatus 10 shown in FIG. 1 are given the same reference numerals and the following description includes only differing points.

The output apparatus 10 of the present modification includes a driver 24, a correction driver 70, two power supply sections 26, two output resistances 28, two transmission paths 30, a high-pass filter 72, an adding section 32, a control section 34, a calibration section 36, and a storage section 38.

The correction driver 70 receives an input signal and outputs a correction signal with a waveform corresponding to the received input signal. For example, the correction driver 70 may be a buffer circuit that amplifies and outputs a voltage signal supplied thereto. The driver 24 and the correction driver 70 may be the same type of voltage buffer circuit and have substantially the same characteristics.

One of the two power supply sections 26 corresponds to the driver 24, and the other power supply section 26 corresponds to the correction driver 70. The power supply section 26 corresponding to the correction driver 70 supplies the correction driver 70 with a drive voltage to set the voltage level of the correction signal output by the correction driver 70. The power supply section 26 corresponding to the correction driver 70 is set with the drive voltage from the control section 34, and outputs the intermediate signal output from the correction driver 70 to have the set voltage level.

The correction driver 70 may also output a correction signal with a waveform inverted relative to the input signal, according to the drive voltage supplied from the power supply section 26. For example, the correction driver 70 may include a circuit that switches whether the correction signal is inverted. The correction driver 70 may output the correction signal with a non-inverted waveform relative to the input signal when a positive voltage is supplied thereto from the power supply section 26 and may output the correction signal with an inverted waveform relative to the input signal when a negative voltage is supplied thereto from the power supply section 26, for example.

One of the two output resistances 28 corresponds to the driver 24, and the other output resistance 28 corresponds to the correction driver 70. One of the transmission paths 30 corresponds to the driver 24, and the other transmission path 30 corresponds to the correction driver 70. The output resistance 28 and the transmission path 30 corresponding to the correction driver 70 are connected in series and transmit the correction signal output by the correction driver 70 to the adding section 32.

The high-pass filter 72 passes the high-frequency component of the correction signal output by the correction driver 70 to the adding section 32. For example, the high-pass filter 72 may be a capacitor that is inserted in series between the adding section 32 and the transmission path 30 corresponding to the correction driver 70.

The adding section 32 of the present modification receives the correction signal passed through the high-pass filter 72 and the intermediate signal output from the driver 24. The adding section 32 of the present modification adds together the correction signal passed through the high-pass filter 72 and the intermediate signal output from the driver 24, and outputs the result as the output signal.

The adding section 32 may include a first signal line 74 that forms a connection between an output end 12 of the output apparatus 10 and an output end of the transmission path 30 transmitting the intermediate signal output by the driver 24, and a second signal line 76 that forms a connection between the first signal line 74 and an output end of the high-pass filter 72. As a result, the adding section 32 can output from the output end 12 the sum of the voltage level of the intermediate signal output by the driver 24 and the voltage level of the correction signal output from the high-pass filter 72.

The control section 34 of the present embodiment sets the voltage level of the correction signal output by the correction driver 70, according to the designated slew rate. For example, the control section 34 may cause the power supply section 26 corresponding to the correction driver 70 to output a drive voltage corresponding to the designated slew rate.

The calibration section 36 of the present modification measures the voltage level of the correction signal that results in an output signal with the designated slew rate. For example, with a prescribed drive voltage being supplied to the correction driver 70, the calibration section 36 may receive the input signal and measure the slew rate of the output signal. The calibration section 36 may then repeatedly change the drive voltage supplied to the correction driver 70 by a prescribed amount and measure the slew rate in the same way. In this way, the calibration section 36 can detect the voltage level of the correction signal that results in an output signal with the prescribed slew rate being acquired.

Figure 9:
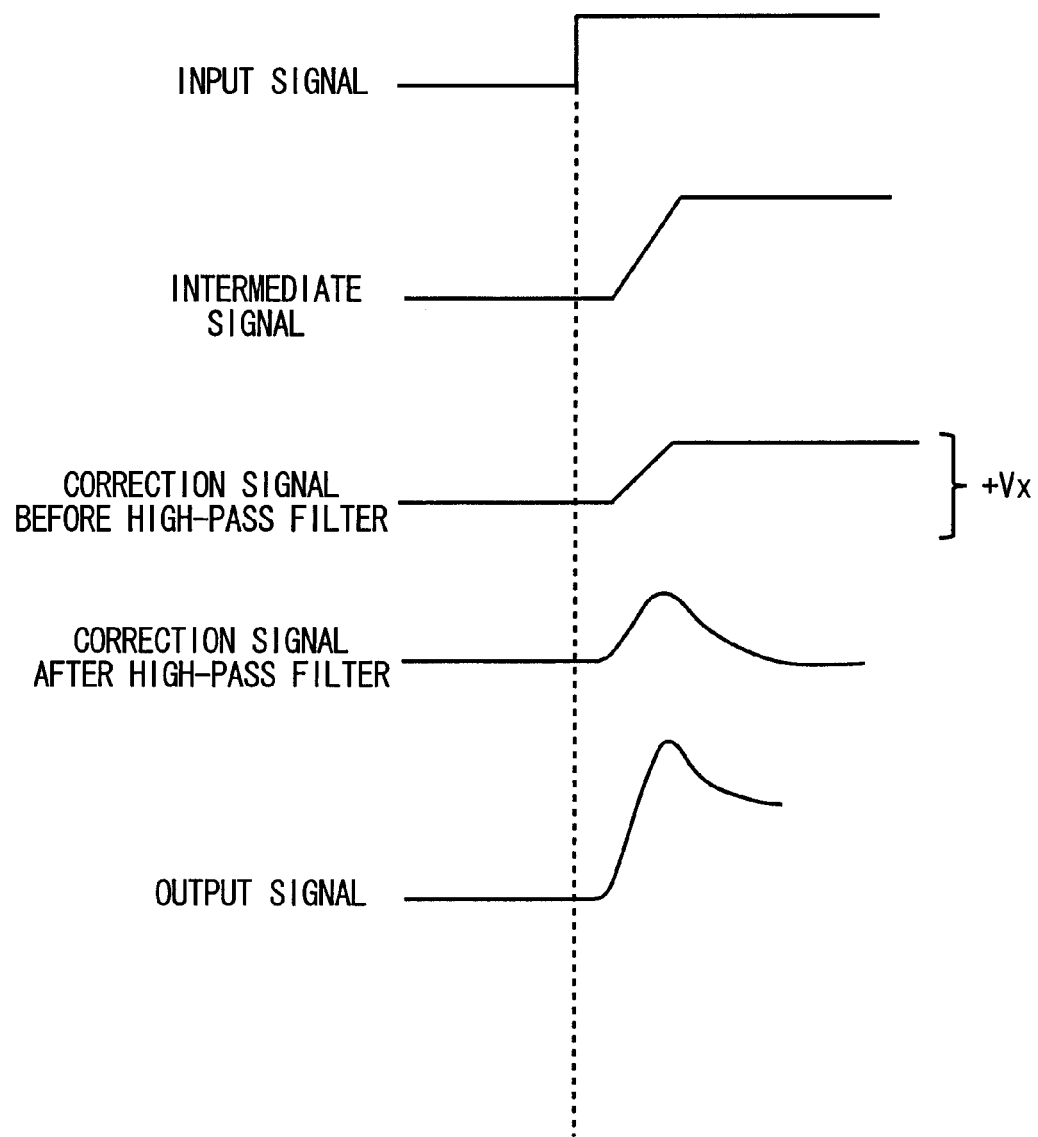
FIG. 9 shows examples of an input signal, an intermediate signal, a correction signal prior to passing through the high-pass filter 72, the correction signal after passing through he high-pass filter 72, and an output signal when the correction driver 70 outputs a correction signal whose waveform is not inverted relative to the input signal.
Figure 10:
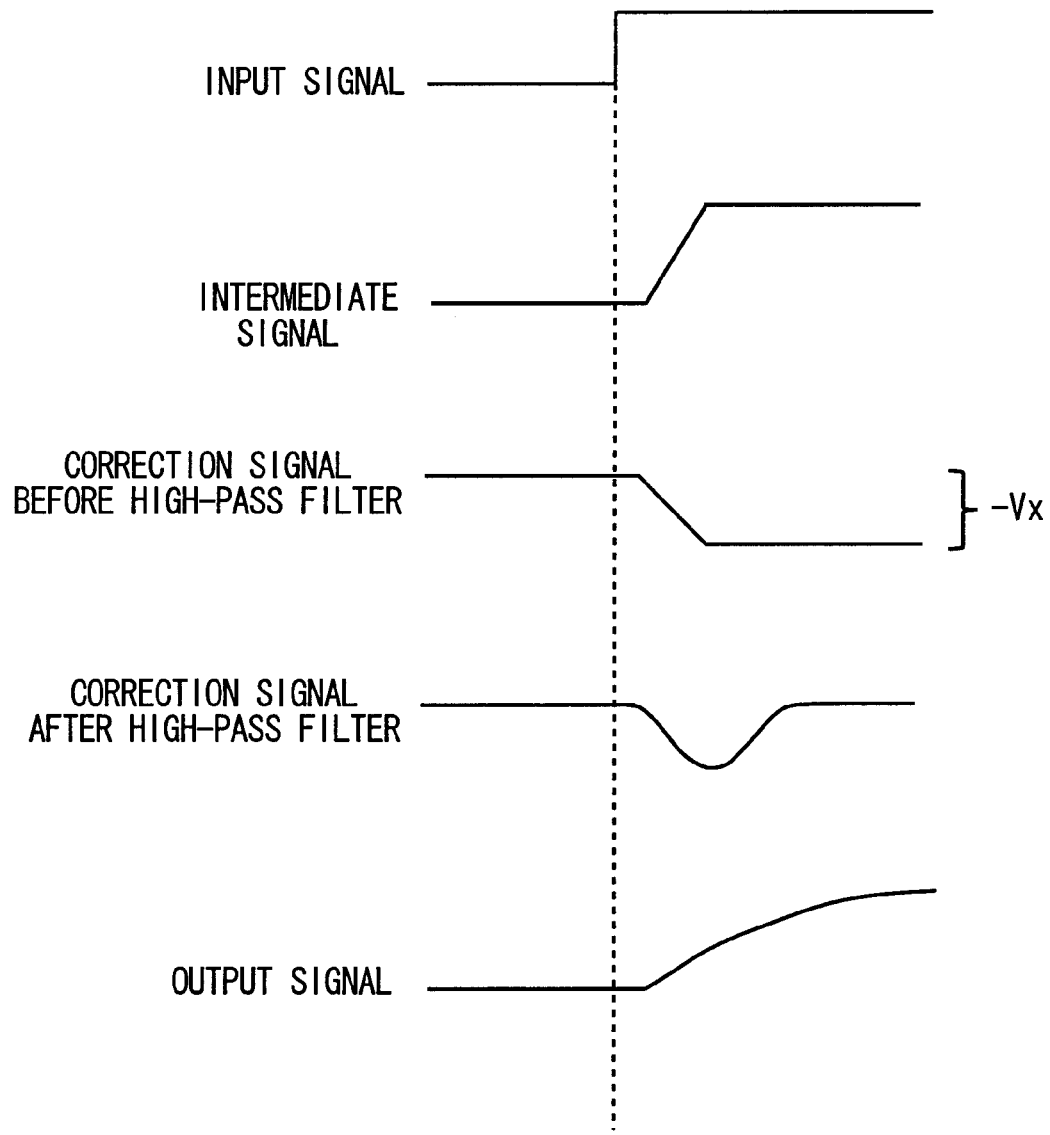
FIG. 10 shows examples of an input signal, an intermediate signal, a correction signal prior to passing through the high-pass filter 72, the correction signal after passing through he high-pass filter 72, and an output signal when the correction driver 70 outputs a correction signal whose waveform is inverted relative to the input signal.

FIGS. 9 and 10 each show an example of an input signal supplied to the output apparatus 10 of the first modification, an intermediate signal output by the driver 24, a correction signal prior to passing through the high-pass filter 72, the correction signal after passing through he high-pass filter 72, and an output signal output from the output apparatus 10. FIG. 9 shows each signal when the correction driver 70 outputs a correction signal whose waveform is not inverted relative to the input signal. FIG. 10 shows each signal when the correction driver 70 outputs a correction signal whose waveform is inverted relative to the input signal.

As shown in FIG. 9, the high-frequency component of the correction signal whose waveform is not inverted relative to the input signal has a mountain-shaped waveform with a peak extending in the same direction as the change of the input signal. Accordingly, when the signal having this waveform is added to the intermediate signal whose waveform is not inverted relative to the input signal, the slope of change of the intermediate signal can be made steeper.

Furthermore, the high-frequency component of the correction signal whose waveform is not inverted relative to the input signal has a larger peak when the amplitude of the correction signal is larger. Accordingly, when the high-frequency component of the correction signal having a larger amplitude and a waveform that is not inverted is added to the intermediate signal whose waveform is not inverted relative to the input signal, the slope of change of the intermediate signal can be made even steeper.

As shown in FIG. 10, the high-frequency component of the correction signal whose waveform is inverted relative to the input signal has a mountain-shaped waveform with a peak extending in the opposite direction of the change of the input signal. Accordingly, when a signal with this waveform is added to the intermediate signal whose waveform is not inverted relative to the input signal, the slope of change of the intermediate signal can be made less steep.

Furthermore, the high-frequency component of the correction signal whose waveform is inverted relative to the input signal has a larger peak when the amplitude of the correction signal is larger. Accordingly, when the high-frequency component of the correction signal having a larger amplitude and a waveform that is inverted is added to the intermediate signal whose waveform is not inverted relative to the input signal, the slope of change of the intermediate signal can be made even less steep.

The peak value of the high-frequency component of the correction signal is larger when the voltage level of the correction signal is larger. Therefore, in the present modification, the control section 34 can change the slew rate of the output signal by changing the voltage level of the correction signal output from the correction driver 70.

Figure 11:
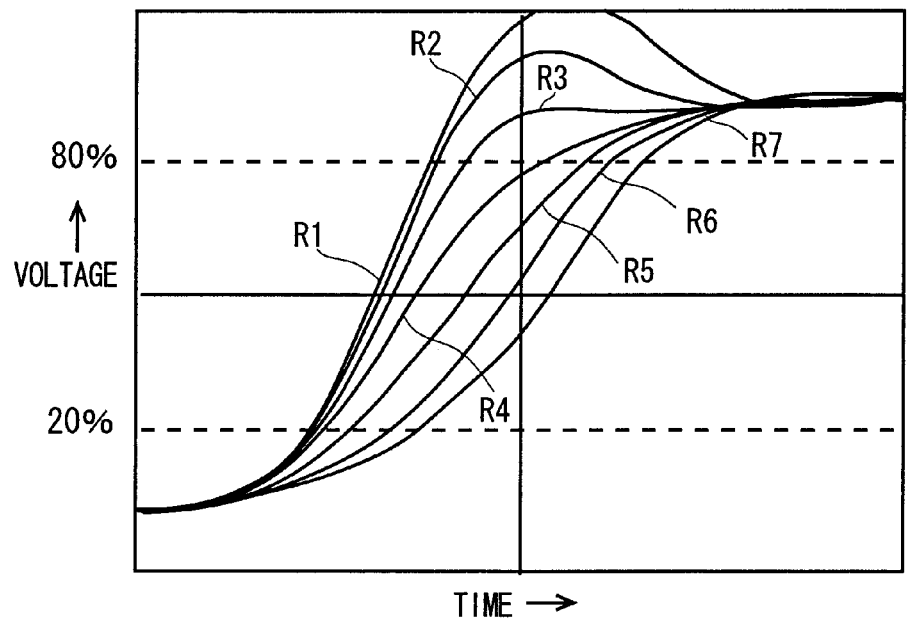
FIG. 11 shows a first example of a rising waveform of the output signal when the voltage level of the correction signal output from the correction driver 70 is changed.
Figure 12:
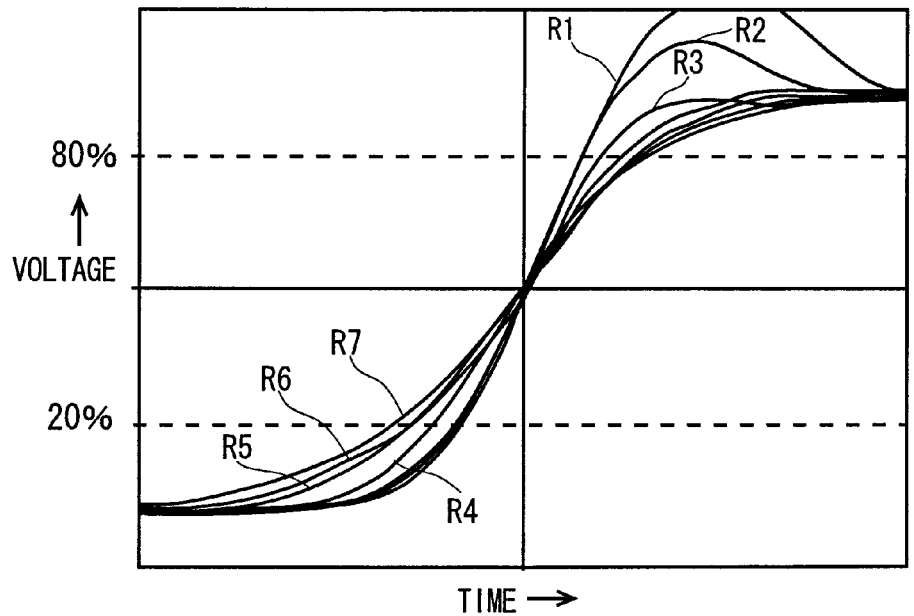
FIG. 12 shows a second example of a rising waveform of the output signal when the voltage level of the correction signal output from the correction driver 70 is changed.

FIG. 11 shows a first example of a rising waveform of the output signal when the voltage level of the correction signal output from the correction driver 70 is changed. FIG. 12 shows a second example of a rising waveform of the output signal when the voltage level of the correction signal output from the correction driver 70 is changed.

In FIGS. 11 and 12, R1, R2, and R3 respectively represent the waveforms of the correction signal with a non-inverted waveform and an amplitude of 1, 2, and 3 volts, R4 represents the waveform obtained when no correction signal is used, and R5, R6, and R7 respectively represent the waveforms of the correction signal with an inverted waveform and an amplitude of 1, 2, and 3 volts. As shown in FIGS. 11 and 12, the output apparatus 10 of the present modification can gradually change the slew rate of the output signal by changing the waveform pattern and the amplitude of the correction signal.

As shown in FIG. 12, the control section 34 may change the waveform pattern and the amplitude of the correction signal such that the time from when the input signal begins to change to when the output signal reaches the prescribed voltage level remains the same. For example, the control section 34 may set the waveform pattern and the amplitude of the correction signal such that the timing at which the amplitude of the output signal is at 50% is the same, regardless of the change in the slew rate.

Figure 13:
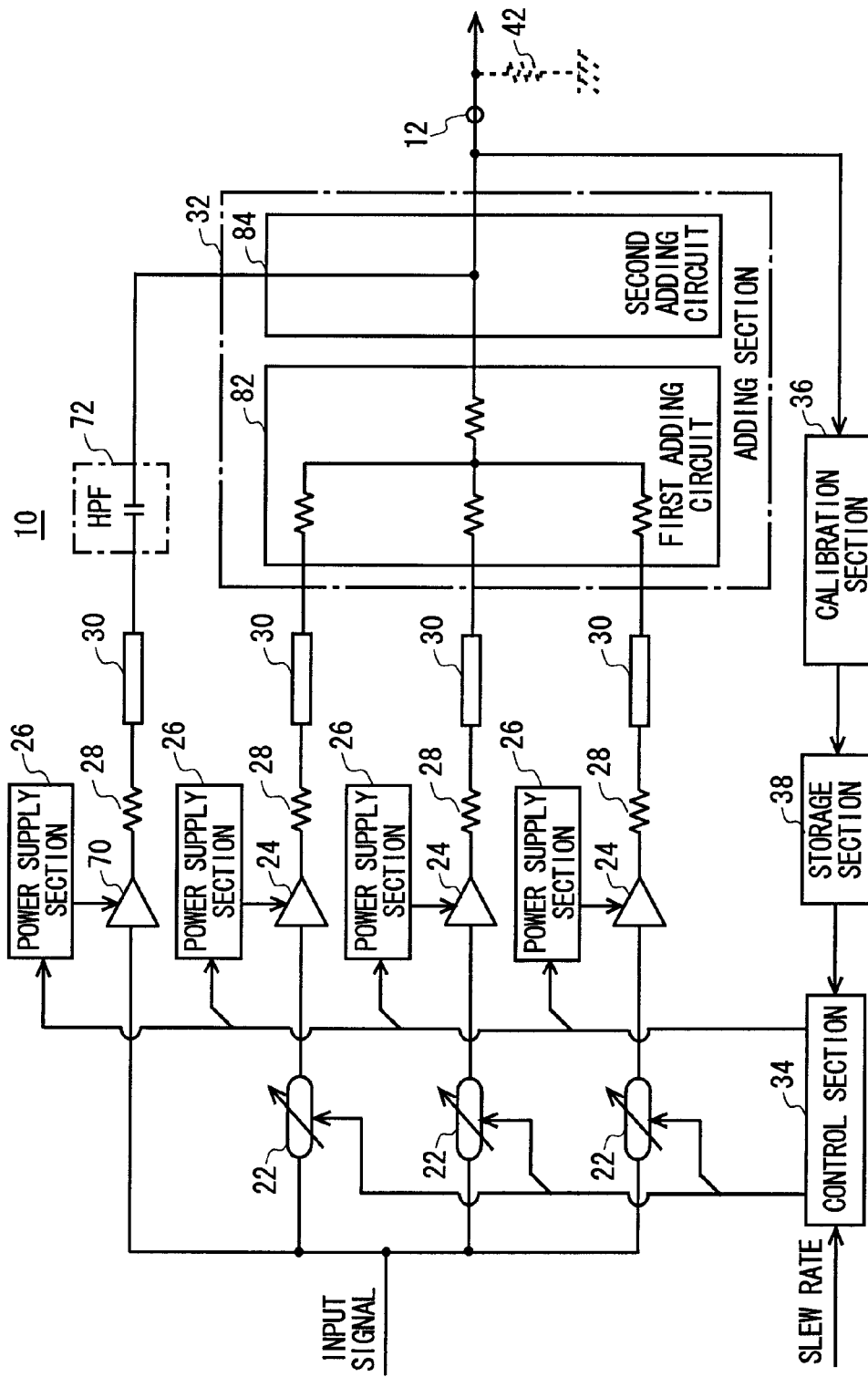
FIG. 13 shows a configuration of an output apparatus 10 according to a second modification of the present embodiment.

FIG. 13 shows a configuration of an output apparatus 10 according to a second modification of the present embodiment. The output apparatus 10 of the present modification adopts substantially the same function and configuration as the output apparatus 10 shown in FIG. 1, and therefore components that are substantially the same as those of the output apparatus 10 shown in FIG. 1 are given the same reference numerals and the following description includes only differing points.

The output apparatus 10 of the present modification further includes a correction driver 70 and a high-pass filter 72. The output apparatus 10 of the present modification also includes a power supply section 26, an output resistance 28, and a transmission path 30 corresponding to the correction driver 70.

The correction driver 70 and the high-pass filter 72 have the same function and configuration as the correction driver 70 and the high-pass filter 72 described in relation to FIG. 8. The power supply section 26, the output resistance 28, and the transmission path 30 corresponding to the correction driver 70 have the same function and configuration as the power supply section 26, the output resistance 28, and the transmission path 30 corresponding to the correction driver 70 described in relation to FIG. 8. Accordingly, the descriptions concerning these components will only include differing points.

The adding section 32 of the present modification receives the intermediate signals output by each of the drivers 24 via the corresponding output resistance 28 and transmission path 30. The adding section 32 receives the correction signal passed through the high-pass filter 72. The adding section 32 adds the correction signal passed through the high-pass filter 72 to the intermediate signals output by the drivers 24, and outputs the result as the output signal.

For example, the adding section 32 of the present modification may include a first adding circuit 82 and a second adding circuit 84. The first adding circuit 82 adds together the voltage levels of the intermediate signals output from the drivers 24. For example, the first adding circuit 82 may have a resistance value as seen from the output end 12 side of the output apparatus 10 that is equal to the resistance value of the termination resistance 42, in the same manner as the adding section 32 described in FIG. 1.

The second adding circuit 84 includes a first signal line 74 that transmits the signal resulting from the addition by the first adding circuit 82 to the output end 12 of the output apparatus 10, and a second signal line 76 that forms a connection between the first signal line 74 and the output end of the high-pass filter 72. In this way, the adding section 32 can add the voltage level of the correction signal output from the high-pass filter 72 to the signal obtained by the first adding circuit 82 as the sum of the voltage levels of the intermediate signals, and output the result from the output end 12.

The control section 34 of the present modification sets the delay amount for each variable delay section 22 and sets the voltage level of the correction signal output from the correction driver 70, according to the designated slew rate. The control section 34 may further set the voltage levels of the intermediate signals output by the drivers 24.

The calibration section 36 of the present modification measures combinations of a delay amount difference among the drivers 24 and a voltage level and waveform pattern of the correction signal output from the correction driver 70 that results in an output signal with the designated slew rate. Furthermore, the calibration section 36 may measure combinations of the voltage levels of the intermediate signals output from the drivers 24.

The output apparatus 10 of the present embodiment can change the slew rate of the output signal more precisely.

Figure 14:
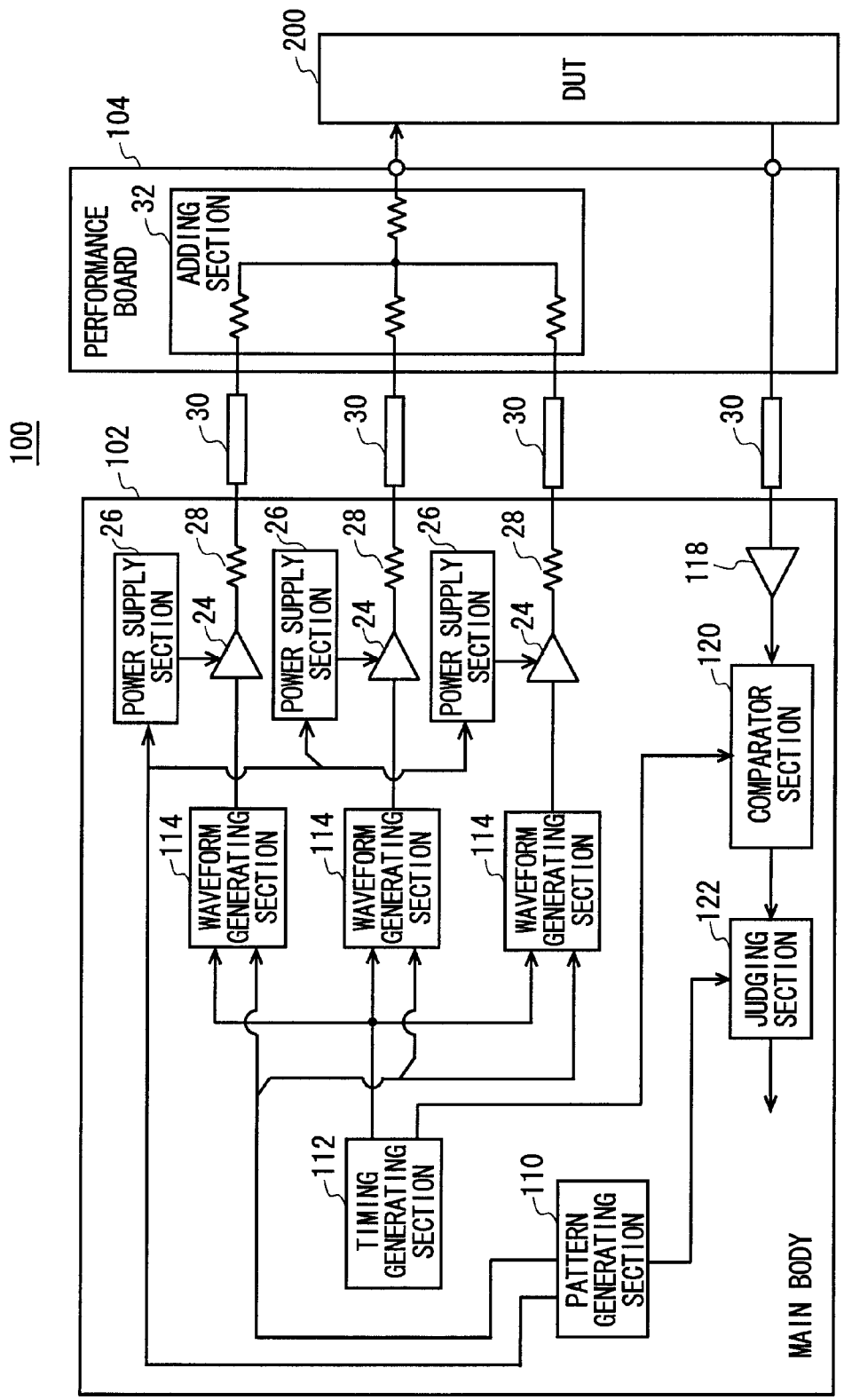
FIG. 14 shows a configuration of a test apparatus 100 according to an embodiment of the present invention.

FIG. 14 shows a configuration of a test apparatus 100 according to an embodiment of the present invention. The test apparatus 100 includes the components of any one of the output apparatuses 10 described in relation to FIGS. 1 to 13. Components of the test apparatus 100 that are substantially the same as those of the output apparatus 10 are given the same reference numerals in FIG. 14 and the following description includes only differing points.

The test apparatus 100 tests a DUT 200. The test apparatus 100 includes a main body 102 and a performance board 104. The main body 102 supplies the device under test (DUT) 200 with a signal and acquires a signal output by the DUT 200.

The DUT 200 is mounted on the performance board 104. The performance board 104 is connected to the main body 102 via a plurality of transmission paths 30.

The main body 102 includes a pattern generator 110, a timing generator 112, a plurality of waveform generating sections 114, a comparator 118, an acquiring section 120, a judging section 122, a plurality of drivers 24, a plurality of power supply sections 26, and a plurality of output resistances 28.

The pattern generator 110 generates a logic pattern that designates a generation timing and a waveform of the signal generated by the main body 102. The pattern generator 110 also generates an expected value pattern that designates an acquisition timing for acquiring the signal and an expected value of the signal input to the main body 102. The pattern generator 110 supplies the logic pattern to the waveform generating section 114. The pattern generator 110 supplies the expected value pattern to the judging section 122.

The timing generator 112 generates a timing signal for designating the timing at which the main body 102 outputs a signal. The timing generator 112 also generates a strobe signal for designating a timing at which a signal is input to the main body 102. The timing generator 112 supplies the timing signal to the waveform generating section 114 and supplies the strobe signal to the acquiring section 120.

Each waveform generating section 114 delays the timing signal supplied thereto by a delay amount corresponding to the generation timing designated by the pattern generator 110. Each waveform generating section 114 generates a logic signal having the waveform designated by the pattern generator 110, at the timing of the delayed timing signal. Each waveform generating section 114 supplies the generated logic signal to the corresponding driver 24.

Each driver 24 supplies the performance board 104, via the corresponding output resistance 28 and transmission path 30, with a signal having a voltage level corresponding to the logic signal supplied from the corresponding waveform generating section 114. The comparator 118 receives a signal from a corresponding terminal of the DUT 200 and generates a logic signal representing a logic value corresponding to the voltage level of the received signal. The comparator 118 supplies the acquiring section 120 with the generated logic signal.

The acquiring section 120 delays the strobe signal supplied from the timing generator 112 by a delay amount corresponding to the acquisition timing designated by the pattern generator 110. The acquiring section 120 acquires the logic value of the logic signal output by the comparator 118, at the timing of the delayed strobe signal. The acquiring section 120 supplies the judging section 122 with the acquired logic value.

The judging section 122 makes a comparison to determine if the logic value acquired by the acquiring section 120 matches the expected value designated by the pattern generator 110. The acquiring section 120 supplies the comparison result to an external control apparatus. Furthermore, the acquiring section 120 may write the comparison result to a memory, for example.

In the present embodiment, the performance board 104 includes an adding section 32. The adding section 32 adds together the signals output from the drivers 24 and supplies the result to a prescribed terminal of the DUT 200 as an output signal.

In the test apparatus 100 described above, each waveform generating section 114 functions as a variable delay section 22 of the output apparatus 10. Furthermore, the pattern generator 110 functions as the control section 34 of the output apparatus 10. In other words, the pattern generator 110 sets delay amounts for the waveform generating sections 114 according to the designated slew rate. As a result, the test apparatus 100 can supply the DUT 200 with a signal giving the designated slew rate. The pattern generator 110 may also change the voltage levels of the intermediate signals output by the drivers 24, according to the designated slew rate.

The performance board 104 may further include a high-pass filter 72. In this case, one driver 24 that supplies the signal to the high-pass filter 72 functions as the correction driver 70. Furthermore, the pattern generator 110 changes the voltage of the signal output by the driver 24 functioning as the correction driver 70. With this configuration as well, the test apparatus 100 can supply the DUT 200 with a signal having the designated slew rate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An output apparatus that outputs an output signal corresponding to an input signal, comprising:
    a delay section that delays the input signal by a delay amount;
    a plurality of drivers, at least one of which receives an output of the delay section, that each output an intermediate signal having a waveform corresponding to the input signal;
    an adding section that adds together the intermediate signals output from the drivers and outputs the result as the output signal;
    a control section that sets the delay amount of the delay section according to a slew rate designated for the output signal; and
    a calibration section that measures the delay amount that results in the output signal having the designated slew rate, wherein
    the control section sets the delay amount based on a result of the measurement by the calibration section.

2. The output apparatus according to claim 1, wherein
    the control section further sets voltage levels of the intermediate signals output by the drivers, according to the designated slew rate.

3. The output apparatus according to claim 1, wherein
    the adding section has a resistance value as seen from an output end side of the output apparatus that matches a resistance value of a termination resistance connected between a reference potential and the output end of the output apparatus.

4. The output apparatus according to claim 1, wherein
    the control section sets the delay amount difference among the drivers such that a time from when the input signal begins changing to when the output signal reaches a predetermined voltage level is the same.

5. The output apparatus according to claim 1, wherein
    the control section sets the delay amount difference among the drivers such that a change period of the output signal is no greater than a time obtained as a sum of each change time of the intermediate signals output by the drivers.

6. The output apparatus according to claim 1, further comprising:
    a correction driver that outputs a correction signal having a waveform corresponding to the input signal; and
    a high-pass filter that passes a high-frequency component of the correction signal output from the correction driver, wherein
    the adding section adds together the intermediate signals output from the drivers and the correction signal passed through the high-pass filter, and outputs the result as the output signal, and
    the control section further sets a voltage level of the correction signal output from the correction driver, according to the designated slew rate.

7. The output apparatus according to claim 1, wherein
    the delay section is one of a plurality of delay sections,
    the output apparatus comprises the plurality of delay sections, and
    each of the plurality of delay sections corresponds to one of the plurality of drivers.

8. The output apparatus according to claim 7, wherein
    each of the plurality of drivers receives an output of the corresponding delay section.

9. An output apparatus that outputs an output signal corresponding to an input signal, comprising:
    a driver that outputs an intermediate signal having a waveform corresponding to the input signal;
    a correction driver that outputs a correction signal having a waveform corresponding to the input signal;
    a high-pass filter that passes a high-frequency component of the correction signal output from the correction driver;
    an adding section that adds together the intermediate signal output from the driver and the correction signal passed through the high-pass filter, and outputs the result as the output signal; and
    a control section that sets a voltage level of the correction signal output from the correction driver, according to a slew rate designated for the output signal.

10. A test apparatus that tests a device under test, comprising an output apparatus that supplies the device under test with a test signal, wherein the output apparatus includes:
    a delay section that delays an input signal by a delay amount;
    a plurality of drivers, at least one of which receives an output of the delay section, that each output an intermediate signal having a waveform corresponding to the input signal;
    an adding section that adds together the intermediate signals output from the drivers and outputs the result as the test signal; and
    a control section that sets the delay amount of the delay section according to a slew rate designated for the output signal;
    a calibration section that measures the delay amount that results in the output signal having the designated slew rate, wherein
    the control section sets the delay amount based on a result of the measurement by the calibration section.

11. The test apparatus according to claim 10, further wherein
    the delay section is one of a plurality of delay sections,
    the output apparatus includes the plurality of delay sections, and
    each of the plurality of delay sections corresponds to one of the plurality of drivers.

12. The test apparatus according to claim 11, wherein each of the plurality of drivers receives an output of the corresponding delay section.

13. A test apparatus that tests a device under test, comprising an output apparatus that supplies the device under test with a test signal, wherein the output apparatus includes:
   a driver that outputs an intermediate signal having a waveform corresponding to an input signal;
   a correction driver that outputs a correction signal having a waveform corresponding to the input signal;
   a high-pass filter that passes a high-frequency component of the correction signal output from the correction driver;
   an adding section that adds together the intermediate signal output from the driver and the correction signal passed through the high-pass filter, and outputs the result as the test signal; and
   a control section that sets a voltage level of the correction signal output from the correction driver, according to a slew rate designated for the output signal.

* * * * *